(12) United States Patent
Li et al.

(10) Patent No.: US 10,580,377 B2
(45) Date of Patent: Mar. 3, 2020

(54) SHIFT REGISTER AND DRIVING METHOD THEREOF, GATE DRIVING CIRCUIT AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Meng Li, Beijing (CN); Ying Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 147 days.

(21) Appl. No.: 15/792,603

(22) Filed: Oct. 24, 2017

(65) Prior Publication Data

US 2018/0286342 A1    Oct. 4, 2018

(30) Foreign Application Priority Data

Mar. 29, 2017   (CN) .......................... 2017 1 0194628

(51) Int. Cl.
*G11C 19/00*   (2006.01)
*G09G 3/36*   (2006.01)
(Continued)

(52) U.S. Cl.
CPC ......... *G09G 3/3677* (2013.01); *G09G 3/2092* (2013.01); *G09G 2310/0286* (2013.01); *G09G 2320/045* (2013.01); *G11C 19/28* (2013.01)

(58) Field of Classification Search
None
See application file for complete search history.

(56) References Cited

U.S. PATENT DOCUMENTS 8,019,039 B1 * 9/2011 Tsai ....................... G11C 19/28
377/64
2011/0044423 A1    2/2011 Lin et al.
(Continued)

FOREIGN PATENT DOCUMENTS

CN    101853705 A    10/2010
CN    102930814 A    2/2013
(Continued)

OTHER PUBLICATIONS

Chinese Office Action dated Nov. 2, 2018 received for corresponding Chinese Application No. 201710194628.3.

*Primary Examiner* — Tuan T Lam
(74) *Attorney, Agent, or Firm* — Kinney & Lange, P.A.

(57) ABSTRACT

The present disclosure provides a shift register and a driving method thereof, a gate driving circuit, and a display apparatus. The shift register comprises an input circuit, a first output circuit, a second output circuit, and a negative voltage switching circuit. The input circuit has an input terminal configured to receive an input signal, an output terminal coupled to a first node, and a control terminal configured to receive a first clock signal. The first output circuit has an input terminal configured to receive a second clock signal, an output terminal coupled to an output signal terminal, and a control terminal coupled to the first node. The second output circuit has an input terminal configured to receive a first low level signal, an output terminal coupled to the output signal terminal, and a control terminal configured to receive a third clock signal. The negative voltage switching circuit has an input terminal configured to receive a second low level signal, an output terminal coupled to the first node, and a control terminal configured to receive a fourth clock signal.

13 Claims, 5 Drawing Sheets

(51) Int. Cl.
*G09G 3/20* (2006.01)
*G11C 19/28* (2006.01)

(56) References Cited

U.S. PATENT DOCUMENTS

| | | | | |
|---|---|---|---|---|
| 2012/0188210 | A1* | 7/2012 | Zhang | G09G 3/3677 345/204 |
| 2012/0212275 | A1* | 8/2012 | Jang | G09G 3/3677 327/295 |
| 2014/0119491 | A1* | 5/2014 | Liu | G11C 19/28 377/64 |
| 2015/0131771 | A1 | 5/2015 | Hu et al. | |
| 2015/0279481 | A1* | 10/2015 | Sasaki | G11C 19/184 377/69 |
| 2016/0071614 | A1* | 3/2016 | Lee | G09G 5/006 345/214 |
| 2016/0133337 | A1* | 5/2016 | Gu | G11C 19/28 377/64 |
| 2016/0141051 | A1* | 5/2016 | Chen | G11C 19/28 377/75 |
| 2018/0301101 | A1* | 10/2018 | Hu | G09G 3/3677 |

FOREIGN PATENT DOCUMENTS

| | | |
|---|---|---|
| CN | 103137061 A | 6/2013 |
| CN | 103400558 A | 11/2013 |
| CN | 106057161 A | 10/2016 |

\* cited by examiner

SHIFT REGISTER AND DRIVING METHOD THEREOF, GATE DRIVING CIRCUIT AND DISPLAY APPARATUS

CROSS-REFERENCE TO RELATED APPLICATION(S)

This application claims priority to the Chinese Patent Application No. 201710194628.3, filed on Mar. 29, 2017, entitled "SHIFT REGISTER AND DRIVING METHOD THEREOF, GATE DRIVING CIRCUIT AND DISPLAY APPARATUS", which is incorporated herein by reference in its entirety.

TECHNICAL FIELD

The present disclosure relates to the field of display technology, and more particularly, to a shift register and a driving method thereof, a gate driving circuit, and a display apparatus.

BACKGROUND

The Gate Driver on Array (GOA for short) technology is a technology of directly fabricating a gate driver circuit on an array substrate. With use of the GOA technology, a gate driving circuit can be directly fabricated around the panel, thereby reducing process complexity and product costs. In addition, high integration of thin film transistor liquid crystal display (TFT-LCD) panels is improved, such that thinner panels can be produced and a narrow bezel design can be achieved.

Existing GOA circuit designs are typically complex with a significant noise. During scanning of one frame, output signal terminals of driver circuits of many GOA circuits are always kept at low levels after high levels are output, so that corresponding TFTs are switched off. In order to ensure the off state of the TFTs, it is often required to maintain a low negative voltage at the pull-up node. However, when the gate of the pull-up transistor is kept at a low negative voltage for a long time, a negative drifting (that is, becoming small) of the threshold voltage (Vth) of the TFT is caused. In the event of the negative drifting of Vth, the TFT may be switched on abnormally. Especially for a panel processed by the IGZO process, Vth itself is close to 0V, and occurrences of the negative drifting will cause the panel not to work properly.

SUMMARY

In order to at least partially address or mitigate the above problems in the prior art, the present disclosure provide a shift register and a driving method thereof, a gate driving circuit, and a display apparatus.

According to an aspect of the present disclosure, there is provided a shift register, comprising an input circuit, a first output circuit, a second output circuit, and a negative voltage switching circuit. The input circuit has an input terminal configured to receive an input signal, an output terminal coupled to a first node, and a control terminal configured to receive a first clock signal. The input circuit is configured to transfer the input signal to the first node under the control of the first clock signal. The first output circuit has an input terminal configured to receive a second clock signal, an output terminal coupled to an output signal terminal, and a control terminal coupled to the first node. The first output circuit is configured to transfer the second clock signal to the output signal terminal under the control of the first node. The second output circuit has an input terminal configured to receive a first low level signal, an output terminal coupled to the output signal terminal, and a control terminal configured to receive a third clock signal. The second output circuit is configured to transfer the first low level signal to the output signal terminal under the control of the third clock signal. The negative voltage switching circuit has an input terminal configured to receive a second low level signal, an output terminal coupled to the first node, and a control terminal configured to receive a fourth clock signal. The negative voltage switching circuit is configured to transfer the second low level signal to the first node under the control of the fourth clock signal. The input signal has a level different from that of the second low level signal.

In an embodiment, the third clock signal is the first clock signal.

In an embodiment, the input circuit comprises a first transistor. The input terminal of the input circuit is one of the source and the drain of the first transistor, the output terminal of the input circuit is the other of the source and the drain of the first transistor, and the control terminal of the input circuit is the gate of the first transistor.

In an embodiment, the first output circuit comprises a second transistor and a capacitor. The input terminal of the first output circuit is one of the source and the drain of the second transistor, the output terminal of the first output circuit is the other of the source and the drain of the second transistor, and the control terminal of the first output circuit is the gate of the second transistor. The capacitor has a first terminal coupled to the first node and a second terminal coupled to the output signal terminal.

In an embodiment, the second output circuit comprises a third transistor. The input terminal of the second output circuit is one of the source and the drain of the third transistor, the output terminal of the second output circuit is the other of the source and the drain of the third transistor, and the control terminal of the second output circuit is the gate of the third transistor.

In an embodiment, the negative voltage switching circuit comprises a fourth transistor. The input terminal of the negative voltage switching circuit is one of the source and the drain of the fourth transistor, the output terminal of the negative voltage switching circuit is the other of the source and the drain of the fourth transistor, and the control terminal of the negative voltage switching circuit is the gate of the fourth transistor.

According to another aspect of the present disclosure, there is provided a gate driving circuit. The gate driving circuit comprises a plurality of cascaded shift registers according to the above embodiments.

According to another aspect of the present disclosure, there is provided a display apparatus. The display apparatus comprises the gate driving circuit according to the above embodiments.

According to another aspect of the present disclosure, there is provided a driving method for driving the shift register according to the above embodiments. The driving method comprises a first pull-down stage and a second pull-down stage. In the first pull-down stage, an input circuit is controlled to be switched off by a first clock signal, and a negative voltage switching circuit is controlled to be switched on by a fourth clock signal, so that a voltage at a first node is reduced to a third level, and an output signal terminal outputs a low level. The second pull-down stage includes a first period and a second period. In the first period, the input circuit is controlled to be switched on by the first clock signal, and the negative voltage switching circuit is controlled to be switched off by the fourth clock signal, so that the voltage at the first node is reduced to a fourth level, and the output signal terminal outputs a low level. In the second period, the input circuit and the negative voltage switching circuit are controlled to be switched off by the first clock signal and the fourth clock signal, so that the voltage at the first node is maintained at the fourth level, and the output signal terminal outputs a low level. The third level is different from the fourth level.

In an embodiment, before the first pull-down stage, the method further comprises a first pull-up stage and a second pull-up stage. In the first pull-up stage, the input circuit and a second output circuit are controlled to be switched on by the first clock signal and a third clock signal, the negative voltage switching circuit is controlled to be switched off by the fourth clock signal, and a second clock signal having a low level is inputted, so that the voltage at the first node is raised to a first level, and the output signal terminal outputs a low level. In the second pull-up stage, the input circuit and the negative voltage switching circuit are controlled to be switched off by the first clock signal and the fourth clock signal, and the second clock signal having a high level is inputted, so that the voltage at the first node is further raised to a second level, and the output signal terminal outputs a high level.

In an embodiment, the first pull-down stage and the second pull-down stage are alternated, so that the voltage at the first node is periodically changed between the third level and the fourth level.

In an embodiment, the third level is a different negative level from the fourth level.

In an embodiment, the third level is higher than the fourth level.

DETAILED DESCRIPTION

Hereinafter, specific embodiments of the present disclosure will be described in detail, and it should be noted that the embodiments described herein are for illustrative purposes only and are not intended to limit the present disclosure. In the following description, numerous specific details are set forth in order to provide a thorough understanding of the present disclosure. It will be apparent, however, to one of ordinary skill in the art that the present disclosure may be practiced without these specific details. In other instances, well-known circuits, materials, or methods are not specifically described in order to avoid obscuring the present disclosure.

Throughout the specification, references to "one embodiment", "an embodiment", "one example" or "an example" mean that a particular feature, structure, or characteristic described in connection with the embodiment or example is incorporated in at least one embodiment of the present disclosure. Thus, the phrase "in one embodiment", "in an embodiment", "in one example" or "in an example" throughout the specification does not necessarily refer to the same embodiment or example. In addition, specific features, structures, or characteristics may be combined in one or more embodiments or examples in any suitable combination and/or sub-combination. In addition, it will be understood by one of ordinarily skilled in the art that the drawings provided herein are for the purpose of illustration and that the drawings are not necessarily to scale. The term "and/or" as used herein includes any and all combinations of one or more of the items listed.

Throughout the specification, the ordinal words "first", "second", etc. are used to distinguish between multiple objects having similar functions or forms, and are not limited to the order of occurrence of the defined objects, dependencies, and the like. For example, when a technical solution is described using only a larger ordinal number (e.g., a second transistor), it does not mean that the technical solution necessarily involves an object not mentioned that has a smaller ordinal number (e.g., a first transistor), the technical solution not defining the object with the smaller ordinal number herein. In other words, it will be understood by those skilled in the art that in some embodiments of the described technical solution, the object having the smaller ordinal number may be included. In other embodiments of the described technical scheme, the object having the smaller ordinal number may not be included.

In the following, the present disclosure will be described in detail with reference to the accompanying drawings.

Figure 1:
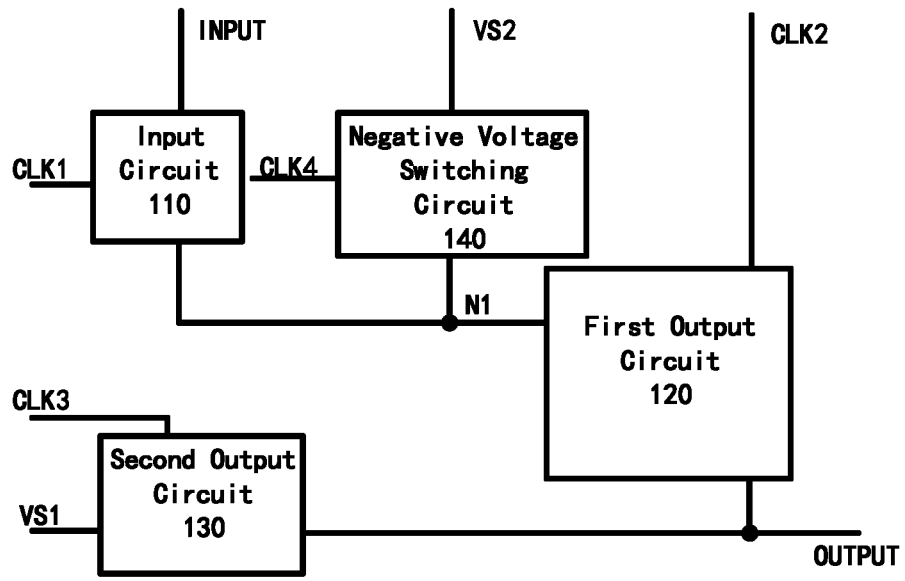
FIG. 1 illustrates a circuit diagram of a shift register according to an embodiment of the present disclosure.

First, FIG. 1 illustrates a circuit diagram of a shift register 100 according to one embodiment of the present disclosure. As shown in FIG. 1, the shift register 100 may include an input circuit 110, a first output circuit 120, a second output circuit 130, and a negative voltage switching circuit 140.

The input circuit 110 has an input terminal configured to receive an input signal INPUT, an output terminal coupled to a first node N1, and a control terminal configured to receive a first clock signal CLK1. The input circuit 110 may be switched on or off under the control of the first clock signal CLK1. When the input circuit 110 is switched on, the input signal INPUT is transferred to the first node N1.

The first output circuit 120 has an input terminal configured to receive a second clock signal CLK2, an output terminal coupled to an output signal terminal, and a control terminal coupled to the first node N1. The first output circuit 120 may be switched on or off under the control of a level of the first node N1. When the first output circuit 120 is switched on, the second clock signal CLK2 is transferred to the output signal terminal.

The second output circuit 130 has an input terminal configured to receive a first low level signal VS1, an output terminal coupled to the output signal terminal, and a control terminal configured to receive a third clock signal CLK3. The second output circuit 130 may be switched on or off under the control of the third clock signal CLK3. When the second output circuit 130 is switched on, the first low level signal VS1 is transferred to the output signal terminal.

The negative voltage switching circuit 140 has an input terminal configured to receive a second low level signal VS2, an output terminal coupled to the first node N1, and a control terminal configured to receive a fourth clock signal CLK4. The negative voltage switching circuit 140 may be switched on or off under the control of the fourth clock signal CLK4. When the negative voltage switching circuit 140 is switched on, the second low level signal VS2 is transferred to the first node N1.

The output signal terminal outputs a signal OUTPUT.

Figure 2:
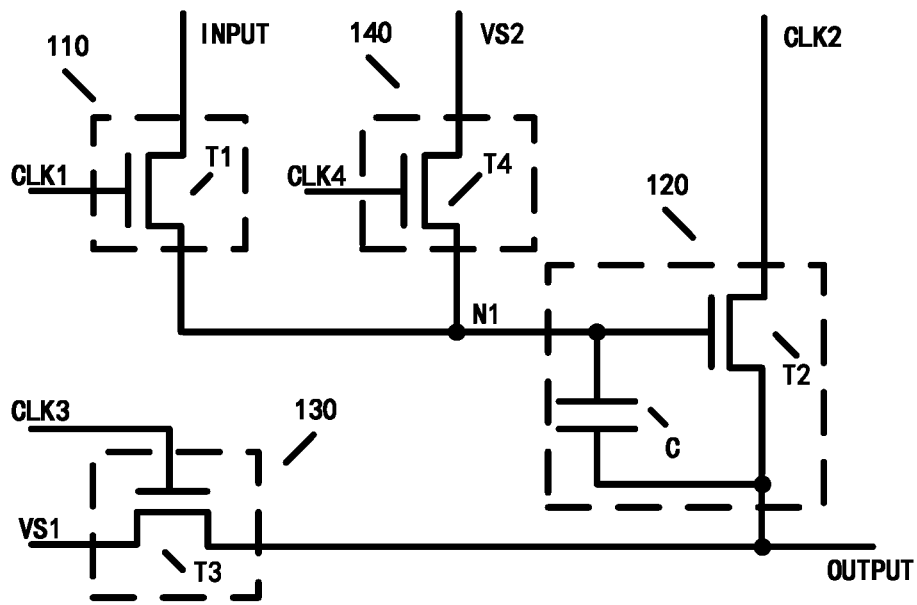
FIG. 2 illustrates a more detailed circuit diagram of the shift register shown in FIG. 1.

FIG. 2 illustrates a more detailed circuit diagram of the shift register 100 shown in FIG. 1 according to one embodiment of the present disclosure.

As shown in FIG. 2, the input circuit 110 may include a first transistor T1. The input terminal of the input circuit 110 may be one of the source and the drain of the first transistor T1, the output terminal of the input circuit 110 may be the other of the source and the drain of the first transistor T1, and the control terminal of the input circuit 110 may be the gate of the first transistor T1.

The first output circuit 120 may include a second transistor T2 and a capacitor C. The input terminal of the first output circuit 120 may be one of the source and the drain of the second transistor T2, the output terminal of the first output circuit 120 may be the other of the source and the drain of the second transistor T2, and the control terminal of the first output circuit 120 may be the gate of the second transistor T2. The capacitor C has a first terminal coupled to the first node N1 and a second terminal coupled to the output signal terminal. That is, the capacitor C is coupled in parallel between the input terminal (the source or the drain of the second transistor T2) and the output terminal (the gate of the second transistor T2) of the first output circuit 120.

The second output circuit 130 may include a third transistor T3. The input terminal of the second output circuit 130 may be one of the source and the drain of the third transistor T3, the output terminal of the second output circuit 130 may be the other of the source and the drain of the third transistor T3, and the control terminal of the second output circuit 130 may be the gate of the third transistor T3.

The negative voltage switching circuit 140 may include a fourth transistor T4. The input terminal of the negative voltage switching circuit 140 may be one of the source and the drain of the fourth transistor T4, the output terminal of the negative voltage switching circuit 140 may be the other of the source and the drain of the fourth transistor T4, and the control terminal of the negative voltage switching circuit 140 may be the gate of the fourth transistor T4.

It is to be noted that the transistors T1-T4 may be N-type transistors or P-type transistors. In the present application, an N-type transistor is described as an example, and it is to be understood that when one or more of the transistors T1-T4 are P-type transistors, the technical solution of the present application can also be realized by adjusting the level setting accordingly.

Figure 3:
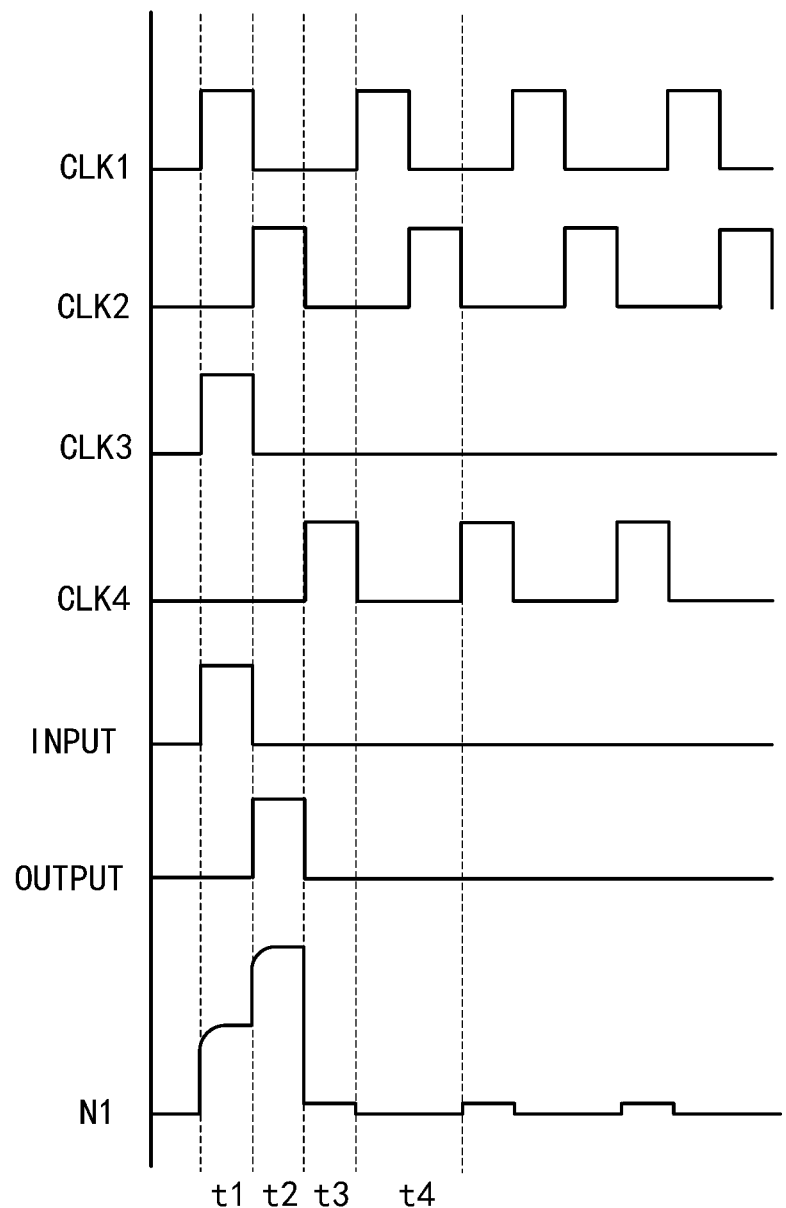
FIG. 3 illustrates a signal timing diagram of the shift register shown in FIG. 1.

FIG. 3 illustrates a signal timing diagram of the shift register 100 as shown in FIGS. 1 and 2. The operations of the shift register 100 will be described below in consideration of four stages in conjunction with FIG. 3. The four stages are a first pull-up stage t1, a second pull-up stage t2, a first pull-down stage t3, and a second pull-down stage t4, respectively. The first pull-up stage t1, the second pull-up stage t2, and the first pull-down stage t3 have the same duration. The second pull-down stage t4 is divided into two periods, each of which has the same duration as one of t1-t3.

As shown in FIG. 3, the input signal INPUT and the first to fourth clock signals CLK1-CLK4 are illustrated as having the same high level VGH and low level VGL. It should be understood that in other embodiments of the present disclosure, the high and low levels of the respective signals may be different. In FIG. 3, levels of the first low level signal VS1 and the second low level signal VS2 are also schematically illustrated. It should also be understood that the level settings of VS1 and VS2 are not limited thereto.

In one embodiment, the level of the second low level signal VS2 is set to be a different negative level from the low level of the input signal INPUT.

In one embodiment, the level of the second low level signal VS2 is set to be closer to 0 Volt than the low level of the input signal INPUT.

For ease of description, the high levels of INPUT and CLK1-CLK4 are set to be the same (for example, 20V), the low levels of INPUT and CLK1-CLK4 are set to be the same as VS1 (for example, −10V), and VS2 (for example, −5V) is set to be higher than VS1. As described above, the technical solution of the present application is not limited by the level setting.

In the first pull-up stage t1, the clock signals CLK1 and CLK3 have the high levels, the clock signals CLK2 and CLK4 have the low levels, and the input signal INPUT has the high level. Thus, the input circuit 110 and the second output circuit 130 are switched on, and the negative voltage switching circuit 140 is switched off.

Accordingly, the input signal INPUT of the high level is transferred to the first node N1, and the level of N1 is raised to a first level (e.g., 20V). Further, the first low level signal VS1 is transferred to the output signal terminal, so that the output signal terminal may output the output signal of the low level (e.g., −10V).

In the second pull-up stage t2, the clock signal CLK2 has the high level, the clock signals CLK1, CLK3, and CLK4 have the low levels, and the input signal INPUT has the low level. Thus, the input circuit 110, the second output circuit 130, and the negative voltage switching circuit 140 are switched off.

Since the level of the first node N1 has been raised to a high level (the first level) in the first pull-up stage t1, the first output circuit 120 is switched on, and the clock signal CLK2 of the high level is transferred to the output signal terminal, and the output signal OUTPUT has a high level (e.g., 20V). At this time, the first output circuit 120 may further raise the level at the first node N1 to be a second level (e.g., 40V). As an example, in the structure of the shift register as shown in FIG. 2, the level at the first node N1 may be further raised by the bootstrap effect of the capacitor C.

In the first pull-down stage t3, the clock signal CLK4 has the high level, the clock signals CLK1, CLK2, and CLK3 have the low levels, and the input signal INPUT has the low level. Thus, the negative voltage switching circuit 140 is switched on, and the input circuit 110 and the second output circuit 130 are switched off.

Accordingly, the second low level signal VS2 is transferred to the first node N1, and the level of N1 is pulled down to a third level (that is, the level of the second low level signal VS2, e.g., −5V). Meanwhile, the output signal OUTPUT of the output signal terminal is also pulled back to the low level of CLK2 (e.g., −10V).

The second pull-down stage t4 is divided into two periods.

In the first period, the clock signal CLK1 has the high level, the clock signals CLK2, CLK3, and CLK4 have the low levels, and the input signal INPUT has the low level. Thus, the input circuit 110 is switched on, and the second output circuit 130 and the negative voltage switching circuit 140 are switched off.

Accordingly, the first clock signal CLK1 of the high level causes the INPUT of the low level to be transferred to the first node N1, and the level of N1 is pulled down to a fourth level (e.g., −10V).

In the second period, the clock signal CLK2 has the high level, the clock signals CLK1, CLK3, and CLK4 have the low levels, and the input signal INPUT has the low level. Thus, the input circuit 110, the second output circuit 130, and the negative voltage switching circuit 140 are switched off. In this second period, the level of the first node N1 is maintained at the fourth level (e.g., −10V).

During the remaining periods of the scanning of one frame, the above first and second pull-down stages are alternated, such that the level at the first node N1 is periodically switched between the third level and the fourth level, until the next frame is scanned. By causing the level at N1 to be alternately switched between the lower negative level (e.g., the fourth level) and the negative level closer to 0 volt (e.g., the third level), N1 is prevented from being at the lower negative level for a long time, thus avoiding the negative drifting of Vth of the TFT.

Figure 4:
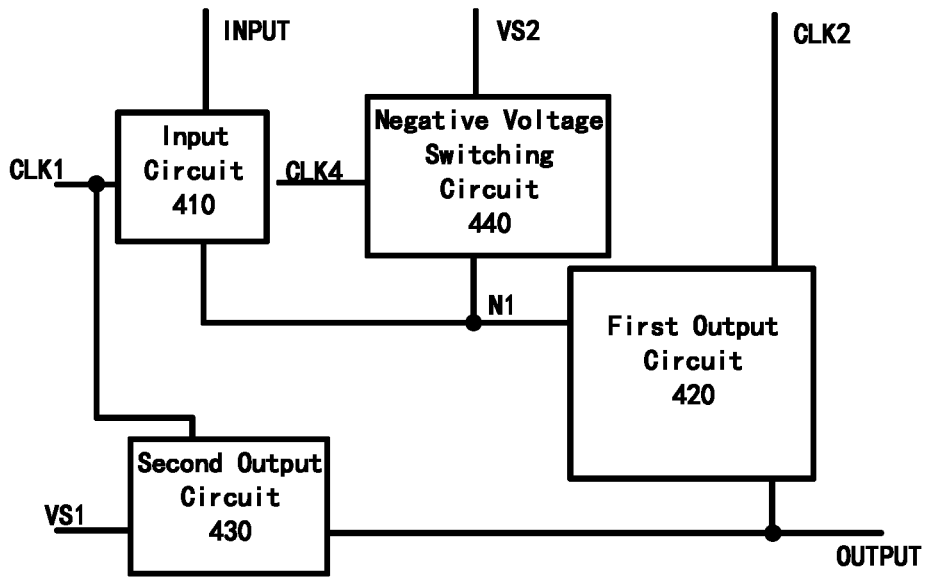
FIG. 4 illustrates a circuit diagram of a shift register according to another embodiment of the present disclosure.

FIG. 4 illustrates a circuit diagram of a shift register 400 according to another embodiment of the present disclosure. Accordingly, FIG. 5 illustrates a more detailed circuit diagram of the shift register 400 shown in FIG. 4 according to the embodiment of the present disclosure.

As shown in FIG. 4, the shift register 400 may include an input circuit 410, a first output circuit 420, a second output circuit 430, and a negative voltage switching circuit 440, which correspond to the respective circuits as shown in FIG. 1. The shift register 400 differs from the shift register 100 as shown in FIG. 1 in that the second output circuit 430 receives the same clock signal as that received by the input circuit 410, that is, the first clock signal CLK1.

Figure 5:
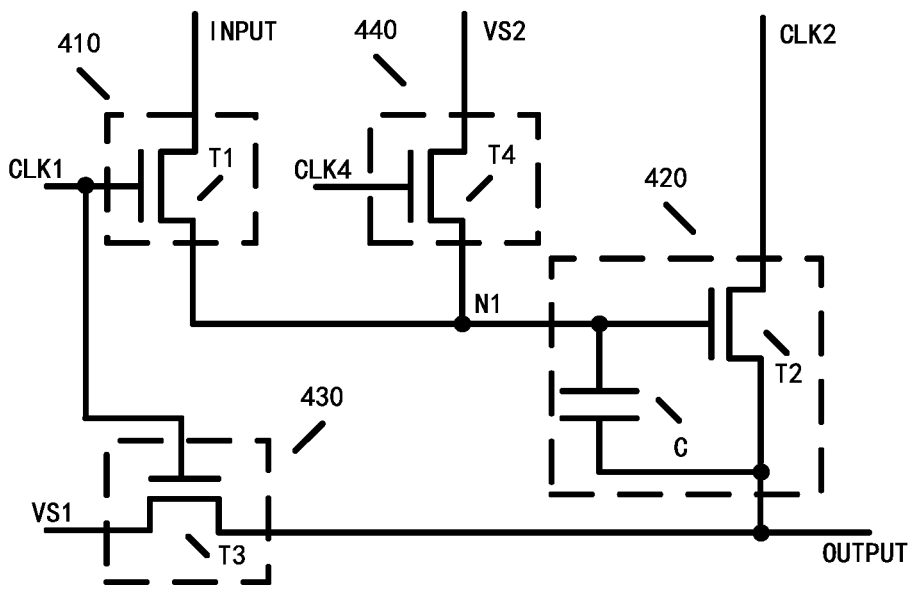
FIG. 5 illustrates a more detailed circuit diagram of the shift register shown in FIG. 4.
Figure 6:
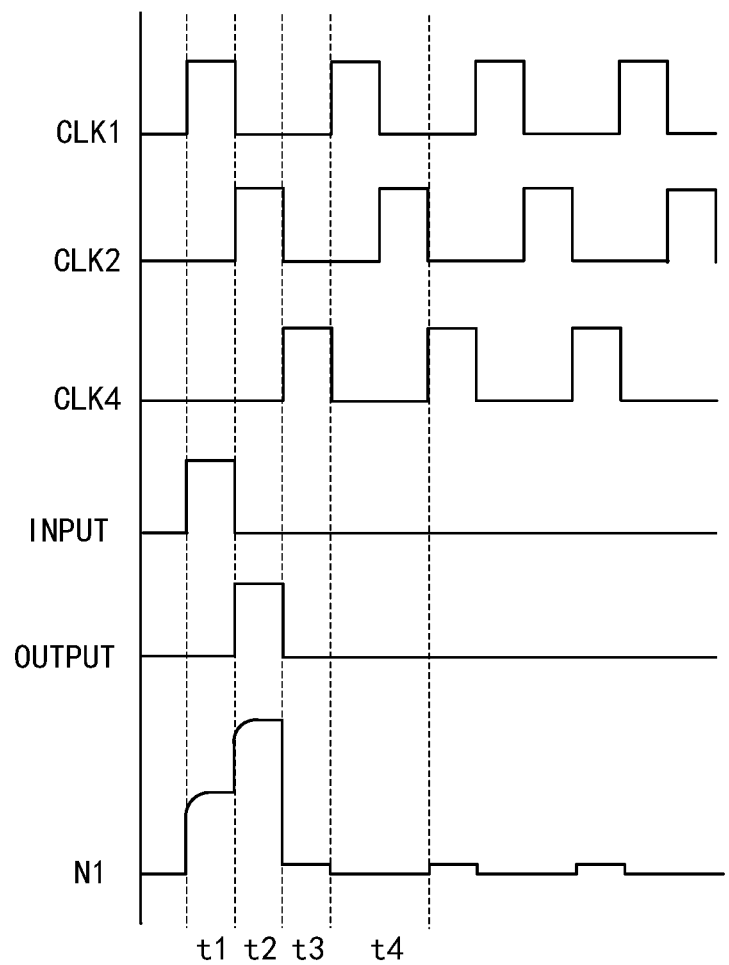
FIG. 6 illustrates a signal timing diagram of the shift register shown in FIG. 4.

FIG. 6 illustrates a signal timing diagram of the shift register 400 as shown in FIGS. 4 and 5. Similarly, the operations of the shift register 400 will be described below in consideration of four stages in conjunction with FIG. 6, that is, a first pull-up stage t1, a second pull-up stage t2, a first pull-down stage t3, and a second pull-down stage t4. It should be noted that the above explanation with respect to FIG. 3 may be equally applicable here for similar situation.

In the first pull-up stage t1, the clock signal CLK1 has the high level, the clock signals CLK2 and CLK4 have the low levels, and the input signal INPUT has the high level. Thus, the input circuit 410 and the second output circuit 430 are switched on, and the negative voltage switching circuit 440 is switched off.

Accordingly, the input signal INPUT of the high level is transferred to the first node N1, and the level of N1 is raised to a first level (e.g., 20V). Further, the first low level signal VS1 is transferred to the output signal terminal, so that the output signal terminal may output the output signal of the low level (e.g., −10V).

In the second pull-up stage t2, the clock signal CLK2 has the high level, the clock signals CLK1 and CLK4 have the low levels, and the input signal INPUT has the low level. Thus, the input circuit 410, the second output circuit 430, and the negative voltage switching circuit 440 are switched off.

Since the level of the first node N1 has been raised to a high level (the first level) in the first pull-up stage t1, the first output circuit 420 is switched on, and the clock signal CLK2 of the high level is transferred to the output signal terminal, and the output signal OUTPUT has a high level (e.g., 20V). At this time, the first output circuit 420 may further raise the level at the first node N1 to be a second level (e.g., 40V). As an example, in the structure of the shift register as shown in FIG. 5, the level at the first node N1 may be further raised by the bootstrap effect of the capacitor C.

In the first pull-down stage t3, the clock signal CLK4 has the high level, the clock signals CLK1 and CLK2 have the low levels, and the input signal INPUT has the low level. Thus, the negative voltage switching circuit 440 is switched on, and the input circuit 410 and the second output circuit 430 are switched off.

Accordingly, the second low level signal VS2 is transferred to the first node N1, and the level of N1 is pulled down to a third level (that is, the level of the second low level signal VS2, e.g., −5V). Meanwhile, the output signal OUTPUT of the output signal terminal is also pulled back to the low level of CLK2 (e.g., −10V).

The second pull-down stage t4 is divided into two periods.

In the first period, the clock signal CLK1 has the high level, the clock signals CLK2 and CLK4 have the low levels, and the input signal INPUT has the low level. Thus, the input circuit 410 and the second output circuit 430 are switched on, and the negative voltage switching circuit 440 is switched off.

Accordingly, the first clock signal CLK1 of the high level causes the INPUT of the low level to be transferred to the first node N1, and the level of N1 is pulled down to a fourth level (e.g., −10V).

In the second period, the clock signal CLK2 has the high level, the clock signals CLK1 and CLK4 have the low levels, and the input signal INPUT has the low level. Thus, the input circuit 410, the second output circuit 430, and the negative voltage switching circuit 440 are switched off. In this second period, the level of the first node N1 is maintained at the fourth level (e.g., −10V).

During the remaining periods of the scanning of one frame, the above first and second pull-down stages are alternated, such that the level at the first node N1 is periodically switched between the third level and the fourth level, until the next frame is scanned. By causing the level at N1 to be alternately switched between the lower negative level (e.g., the fourth level) and the negative level closer to 0 volt (e.g., the third level), N1 is prevented from being at the lower negative level for a long time, thus avoiding the negative drifting of Vth of the TFT.

Figure 7:
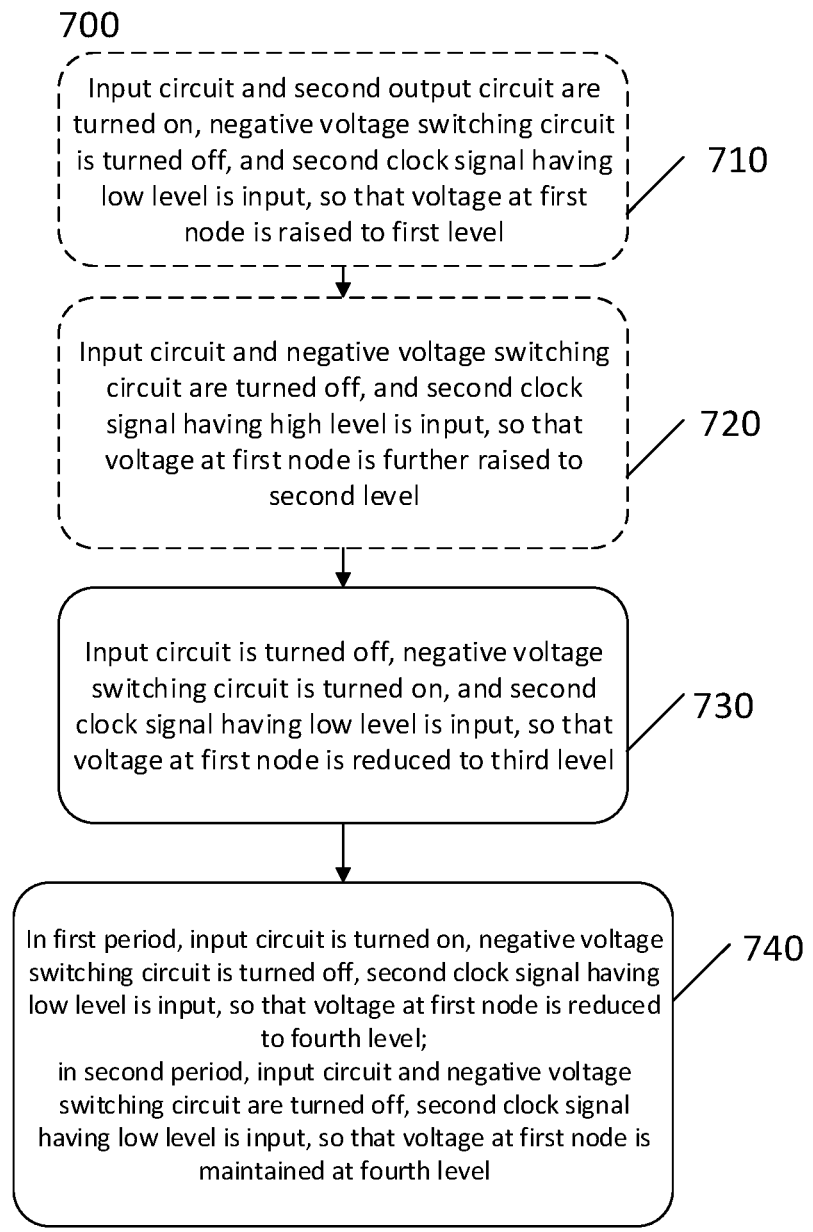
FIG. 7 illustrates a flowchart of a driving method for driving a shift register according to an embodiment of the present disclosure.

FIG. 7 illustrates a flowchart of a driving method 700 for driving a shift register according to an embodiment of the present disclosure. The shift register may be the shift register 100 according to the embodiment as shown in FIGS. 1 and 2 or the shift register 400 according to the embodiment as shown in FIGS. 4 and 5. It should be noted that the above explanation with respect to the shift register 100 or the shift register 400 may be equally applicable here.

In one embodiment of the present disclosure, the driving method 700 may include a first pull-up stage 710, a second pull-up stage 720, a first pull-down stage 730, and a second pull-down stage 740. It should be noted that the first pull-up stage 710 and the second pull-up stage 720 are not indispensable stages in the driving method 700 (shown by dashed lines in FIG. 7). In other embodiments of the present disclosure, the first pull-up stage 710 and the second pull-up stage 720 may not be provided, or the functions of the first pull-up stage 710 and the second pull-up stage 720 may be achieved by other alternative operations.

Specifically, in the first pull-up stage 710, the input circuit and the second output circuit are controlled to be switched on by the first and third clock signals, and the negative voltage switching circuit is controlled to be switched off by the fourth clock signal, and the second clock signal having a low level is inputted, so that the voltage at the first node is raised to the first level and the output signal terminal outputs a low level.

In the second pull-up stage 720, the input circuit and the negative voltage switching circuit are controlled to be switched off by the first and fourth clock signals, and the second clock signal having a high level is inputted, so that the voltage at the first node is further raised to the second level and the output signal terminal outputs a high level.

In the first pull-down stage 730, the input circuit is controlled to be switched off by the first clock signal, the negative voltage switching circuit is controlled to be switched on by the fourth clock signal, and the second clock signal having a low level is inputted, so that the voltage at the first node is reduced to the third level and the output signal terminal outputs a low level.

The second pull-down stage 740 includes a first period and a second period. In the first period, the input circuit is controlled to be switched on by the first clock signal, the negative voltage switching circuit is controlled to be switched off by the fourth clock signal, and the second clock signal having a low level is inputted, so that the voltage at the first node is reduced to the fourth level and the output signal terminal outputs a low level. In the second period, the input circuit and the negative voltage switching circuit are controlled to be switched off by the first and fourth clock signals, and the second clock signal having a low level is inputted, so that the voltage at the first node is maintained at the fourth level and the output signal terminal outputs a low level.

In one embodiment, the first pull-down stage 730 and the second pull-down stage 740 are alternated, such that the voltage at the first node is periodically changed between the third level and the fourth level.

In the embodiment as shown in FIGS. 1 and 2, the third level and the fourth level are realized by the second low level signal VS2 and the low level of CLK1, respectively. In one embodiment, the third level is a different negative level from the fourth level. In one embodiment, the third level is closer to 0 Volt than the fourth level.

According to another aspect of the present disclosure, there is provided a gate driving circuit. The gate driving circuit may include a plurality of cascaded shift registers according to the above embodiments (e.g., the shift register 100 or the shift register 400).

In addition, the present disclosure also provides a display apparatus including the above-described gate driver. Specifically, the display apparatus may be a liquid crystal display apparatus such as a liquid crystal panel, a liquid crystal television, a mobile phone, an electronic reader, a liquid crystal display, or the like.

The purposes, technical solutions, and advantageous effects of the present disclosure have been described in further detail with reference to the specific embodiments described above. It should be understood that the foregoing is merely illustrative of the specific embodiments of the present disclosure and is not intended to be limiting of the present disclosure, and that any modifications, equivalents, improvements, etc., which fall into the spirit and principles of this disclosure, are intended to be included within the scope of the present disclosure.

We claim:

1. A shift register, comprising:
an input circuit having an input terminal configured to receive an input signal, an output terminal coupled to a first node, and a control terminal configured to receive a first clock signal, and configured to transfer the input signal to the first node under control of the first clock signal;

a first output circuit having an input terminal configured to receive a second clock signal, an output terminal coupled to an output signal terminal, and a control terminal coupled to the first node, and configured to transfer the second clock signal to the output signal terminal under control of the first node;

a second output circuit having an input terminal configured to receive a first low level signal, an output terminal coupled to the output signal terminal, and a control terminal configured to receive a third clock signal, and configured to transfer the first low level signal to the output signal terminal under control of the third clock signal; and a negative voltage switching circuit having an input terminal configured to receive a second low level signal, an output terminal coupled to the first node, and a control terminal configured to receive a fourth clock signal, and configured to transfer the second low level signal to the first node under control of the fourth clock signal, wherein the input signal has a different level from that of the second low level signal, and wherein the input circuit and the negative voltage switching circuit are configured to, under the control of the first clock signal and the fourth clock signal, switch the level at the first node between the level of the input signal and the level of the second low level signal alternatively after a signal output by the first output circuit is changed from a high level signal to a low level signal in a frame.

2. The shift register according to claim 1, wherein the third clock signal and the first clock signal are the same.

3. The shift register according to claim 1, wherein the input circuit comprises a first transistor, and wherein the input terminal of the input circuit is one of a source and a drain of the first transistor, the output terminal of the input circuit is the other of the source and the drain of the first transistor, and the control terminal of the input circuit is a gate of the first transistor.

4. The shift register according to claim 1, wherein the first output circuit comprises a second transistor and a capacitor, and wherein the input terminal of the first output circuit is one of a source and a drain of the second transistor, the output terminal of the first output circuit is the other of the source and the drain of the second transistor, and the control terminal of the first output circuit is a gate of the second transistor, and wherein the capacitor has a first terminal coupled to the first node and a second terminal coupled to the output signal terminal.

5. The shift register according to claim 1, wherein the second output circuit comprises a third transistor, and wherein the input terminal of the second output circuit is one of a source and a drain of the third transistor, the output terminal of the second output circuit is the other of the source and the drain of the third transistor, and the control terminal of the second output circuit is a gate of the third transistor.

6. The shift register according to claim 1, wherein the negative voltage switching circuit comprises a fourth transistor, and wherein the input terminal of the negative voltage switching circuit is one of a source and a drain of the fourth transistor, the output terminal of the negative voltage switching circuit is the other of the source and the drain of the fourth transistor, and the control terminal of the negative voltage switching circuit is a gate of the fourth transistor.

7. A gate driving circuit comprising a plurality of cascaded shift registers according to claim 1.

8. A display apparatus comprising the gate driving circuit according to claim 7.

9. A driving method for driving the shift register according to claim 1, comprising:
- a first pull-down stage in which the input circuit is controlled to be switched off by the first clock signal, and the negative voltage switching circuit is controlled to be switched on by the fourth clock signal, so that a voltage at the first node is reduced to a third level, and the output signal terminal outputs a low level;
- a second pull-down stage including a first period and a second period,
    - wherein in the first period, the input circuit is controlled to be switched on by the first clock signal, and the negative voltage switching circuit is controlled to be switched off by the fourth clock signal, so that the voltage at the first node is reduced to a fourth level, and the output signal terminal outputs the low level; and
    - wherein in the second period, the input circuit and the negative voltage switching circuit are controlled to be switched off by the first clock signal and the fourth clock signal, so that the voltage at the first node is maintained at the fourth level, and the output signal terminal outputs the low level,
- wherein the third level is different from the fourth level.

10. The method according to claim 9, wherein before the first pull-down stage, the method further comprises:
- a first pull-up stage in which the input circuit and the second output circuit are controlled to be switched on by the first clock signal and the third clock signal, the negative voltage switching circuit is controlled to be switched off by the fourth clock signal, and the second clock signal having the low level is inputted, so that the voltage at the first node is raised to a first level, and the output signal terminal outputs the low level; and
- a second pull-up stage in which the input circuit and the negative voltage switching circuit are controlled to be switched off by the first clock signal and the fourth clock signal, and the second clock signal having a high level is inputted, so that the voltage at the first node is further raised to a second level, and the output signal terminal outputs the high level.

11. The method according to claim 9, wherein the first pull-down stage and the second pull-down stage are alternated, so that the voltage at the first node is periodically changed between the third level and the fourth level.

12. The method according to claim 9, wherein the third level is a different negative level from the fourth level.

13. The method according to claim 9, wherein the third level is higher than the fourth level.

* * * * *